(12) United States Patent
Okamura et al.

(10) Patent No.: US 6,969,679 B2
(45) Date of Patent: Nov. 29, 2005

(54) FABRICATION OF NANOSCALE THERMOELECTRIC DEVICES

(75) Inventors: Yoshimasa Okamura, Sunnyvale, CA (US); Timothy L. Kohler, San Jose, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 32 days.

(21) Appl. No.: 10/720,269

(22) Filed: Nov. 25, 2003

(65) Prior Publication Data

US 2005/0112872 A1    May 26, 2005

(51) Int. Cl.[7] ............................................. H01L 21/44
(52) U.S. Cl. ........................................................ 438/666
(58) Field of Search ................................ 438/666, 597, 438/414, 415, 356, 570, 468, 667, 106

(56) References Cited

U.S. PATENT DOCUMENTS

| | | | |
|---|---|---|---|
| 4,971,632 A | 11/1990 | Rowe | 136/212 |
| 4,983,225 A | 1/1991 | Rowe | 136/201 |
| 5,286,304 A | 2/1994 | Macris et al. | 136/201 |
| 5,517,468 A * | 5/1996 | Inoue et al. | 368/64 |
| 5,581,091 A | 12/1996 | Moskovits et al. | 257/9 |
| 5,837,929 A | 11/1998 | Adelman | 136/225 |
| 5,921,087 A | 7/1999 | Bhatia et al. | 62/3.2 |
| 6,127,619 A | 10/2000 | Xi et al. | 136/203 |
| 6,207,887 B1 | 3/2001 | Bass et al. | 136/201 |
| 6,214,738 B1 | 4/2001 | Aiba et al. | 438/707 |
| 6,231,744 B1 | 5/2001 | Ying et al. | 205/324 |
| 6,232,542 B1 | 5/2001 | Hiraishi et al. | 136/201 |
| 6,359,288 B1 | 3/2002 | Ying et al. | 257/14 |
| 6,388,185 B1 * | 5/2002 | Fleurial et al. | 136/205 |
| 6,441,295 B2 | 8/2002 | Hiraishi et al. | 136/201 |
| 6,441,296 B2 | 8/2002 | Hiraishi et al. | 136/201 |
| 6,489,704 B1 * | 12/2002 | Kucherov et al. | 310/306 |
| 6,605,772 B2 | 8/2003 | Harman et al. | 136/236.1 |
| 6,787,691 B2 * | 9/2004 | Fleurial et al. | 136/203 |
| 2002/0158342 A1 | 10/2002 | Tuominen et al. | 428/195 |
| 2002/0170590 A1 | 11/2002 | Heremans et al. | 136/240 |
| 2003/0041892 A1 | 3/2003 | Parsons et al. | 136/200 |
| 2003/0047204 A1 | 3/2003 | Fleurial et al. | 136/200 |

FOREIGN PATENT DOCUMENTS

JP          63-20880         1/1988

(Continued)

OTHER PUBLICATIONS

"Introduction to Thermoelectrics", website, http:/www.thermoelectrics.com/introduction.htm, site visited Jul. 28, 2003.

(Continued)

*Primary Examiner*—David Nhu
(74) *Attorney, Agent, or Firm*—Fitzpatrick, Cella, Harper & Scinto

(57) ABSTRACT

In a method for fabricating a nanowire thermoelectric device, a first electrode pattern is formed on a substrate, wherein the first electrode pattern includes bottom electrodes and a first set of connections which connects the bottom electrodes to form first and second groups of electrically connected bottom electrodes. P-type nanowires and n-type nanowires are selectively formed on the substrate by selectively activating either the first group of electrically connected bottom electrodes and the second group. The p-type and n-type nanowires are then connected by top electrodes. A first set of holes in the substrate is formed to remove the first set of connections. A second set of holes to allow for electrical access to the bottom electrodes, and a second set of connections are formed, so as to result in an array of thermocouples connected to each other in parallel banks of series-connected thermocouples.

11 Claims, 11 Drawing Sheets

FOREIGN PATENT DOCUMENTS

| JP | 11-298051 | 10/1999 |
|---|---|---|
| JP | 2001-282396 | 10/2001 |
| WO | 03/077298 | 9/2003 |

OTHER PUBLICATIONS

M.S. Dresselhaus, et al., "The Promise of Low Dimensional Systems for Thermoelectric Applications," website, http://www.osti.gov/fcvt/darpa2002/mdresselhaus.pdf, site visited Sep. 18, 2003.

"Thermoelectricity" website, http://www.nanothermel.org/public_main.htm, site visit d Jul. 28, 2003.

"Stacy Group" Stacy Group Thermoelectrics Research, website, http://www.cchem.berkely._du/~amsgrp/thermo-electrics.html, site visited Aug. 29, 2003.

"Design of Advanced Materials" Stacy Group Home, website, http://www.cchem.berkeley.edu/~amsgrp/index.html, site visited Jul. 28, 2003.

"Eneco Technology" r-layout2, website, http://www.eneco-usa.com/technology/content.htm, site visited Jul. 28, 2003.

Marlow Industries Inc. thermoelectric manufacturer Marlow Industries inc., website, http://www.marlow.com/, site visited Jul. 28, 2003.

Hi-Z Technology Hi-Z TECHNOLOGY, Inc., website, http://www.hi-z.com/, site visited Jul. 28, 2003.

"TELLUREX Z-Max thermoelectric modules for power generation . . . " Tellurex Corporation, website, http://www.tellurex.com/, site visited Jul. 28, 2003.

"A Quantum Leap in Power Generation" Power Chips plc, website, http://www.powerchips.gi/, site visited Jul. 28, 2003.

"The Science Behind Power Chips™, A Basic Introduction" Power Chips plc, website, http://www.powerchips.gi/technology/overview.shtml, site visited Jul. 28, 2003.

M.S. Dresselhaus, et al., "Investigation of Low-Dimensional Thermoelectrics", *Symposium Proceeding, Technomoic Publishing Co.*, pp. 1-13.

M.S. Dresselhaus, et al., "Nanowires for Thermoelectric Applications", *Massachusetts Institute of Technology*.

* cited by examiner

FABRICATION OF NANOSCALE THERMOELECTRIC DEVICES

BACKGROUND AND SUMMARY

1. Field of the Invention

The present invention generally relates to a method for fabricating nanowire thermoelectric devices.

2. Description of the Related Art

Nanowires are known in the art as wire structures which have a diameter measured in hundreds of nanometers (nm) or less, typically measured from 1 to 500 nm. When devices are constructed using structures of such a small scale, quantum mechanical rules and phenomena begin to have a greater effect on the operation of such devices in comparison to larger scale structures. The increased role and effect of quantum mechanics is due to the reduced number of atoms and electrons present in the system, which makes their discrete quantum natures more apparent.

While it is not known how quantum mechanics will affect the operation of all nanoscale devices, it has been found that thermoelectric modules (TEMs) constructed using nanowires are likely to show increased efficiency relative to even microsized TEM devices made with bulk materials.

The basic unit of a thermoelectric module is the thermocouple. A thermocouple which is typically made of two thermoelements of different materials, a p-type thermoelement and a n-type thermoelement, connected to each other at a high temperature side and a low temperature side. P-type thermoelements, made from p-type materials, transport charge through holes where electrons are missing. N-type thermoelements, made from n-type materials, transport charge with electrons which travel through the material.

At the high temperature side and the low temperature side, electrodes (p-n connection electrodes) may be provided to connect the two thermoelements. If appropriate materials are chosen for the thermoelements, applying a temperature difference between the two sides develops an electric current at the p-n connection electrodes and, conversely, applying a current to one of the p-n connection electrodes results in a temperature difference between the two sides. Thus, a thermoelectric module may function as either an electric generator or a cooling device.

It is known in the art that the amount of electric current produced by a thermocouple is proportional to the difference in temperature between the two sides of the thermocouple. This phenomena is known as the Seebeck effect, wherein heat energy is converted into electrical energy. Consequently, the Seebeck effect has been identified as a tool for recovering excess or waste heat energy.

The ability of a thermocouple to transfer heat with the application of an electric current is known as the Peltier effect. The amount of heat a thermocouple will transfer depends in part on the magnitude of the current applied. This effect has been employed to provide refrigerators and circuit cooling devices with no mechanical parts.

Another determining factor in the ability of a thermocouple to either absorb heat or produce electricity is the materials used in the p-type and n-type thermoelements. The thermoelectric property of a material is measured in terms of a dimensionless figure of merit (ZT). ZT is defined as follows:

$$ZT = (S^2 \sigma / \kappa) T$$

where S is the material's Seebeck coefficient, $\sigma$ is a measure of the material's electrical conductivity, $\kappa$ is a measure of the material's thermal conductivity, and T is the temperature.

As is apparent from the definition of ZT, desirable thermoelectric materials have high electrical conductivity, yet low thermal conductivity. Early research in the area of thermoelectrics focused on the use of metals as thermoelements. However, since the relationship between electrical conductivity and thermal conductivity for metals is fixed, the research yielded limited success. Consequently, attention was shifted to develop the use of semiconductors in thermoelectric modules, since semiconductors are capable of both high electrical conductivity and low thermal conductivity.

As noted above, it has been suggested that thermoelectric modules be constructed using nanowires, since some studies have indicated that quantum effects enhance thermoelectric effects. Nanowire thermoelectric modules are envisioned as arrays of nanowires, where p-type and n-type nanowires alternate spatially and are close in proximity to each other so that they may be coupled together. Ideally, all the wires are packed tightly together to increase the number of thermocouples within a thermoelectric module in relation to the size of the module. Significant efforts are now being directed towards the development of such thermoelectric modules.

However, nanoscale elements are not easily produced by conventional methods. In addition, since generation of electricity normally entails a large temperature gradient between the two sides of thermocouples, it is preferred that the thermoelements be as long as possible to increase the distance between the two sides. This is difficult for nanowires and their small diameters because increased length would increase the fragility of the nanowires. Conventional methods typically would not meet tolerances required for the production of nanowire thermoelectric modules and would likely damage their fragile structures.

SUMMARY OF THE INVENTION

The present invention relates to methods for fabricating nanowire thermoelectric devices. In general, the present invention provides methods in which a first bottom electrode pattern is provided which allows for the selective formation of nanowires, and in which the first bottom electrode pattern is later replaced with a second bottom electrode pattern which may be more suitable for thermoelectric connectivity between thermocouples in comparison with the first bottom electrode pattern. In one aspect of the present invention, the first bottom electrode pattern is replaced with the second bottom electrode pattern by using two sets of holes formed in the substrate.

Thus, according to the invention a nanowire thermoelectric device is fabricated by forming a first bottom electrode pattern on a substrate, where the first bottom electrode pattern comprises a first group of bottom electrodes, a second group of bottom electrodes, and a first set of connections. The first set of connections is divided into at least two subsets of connections, wherein one subset connects the first group of bottom electrodes and the second subset connects the second group of bottom electrodes. Thus, the first set of connections forms first and second electrically connected groups of bottom electrodes.

The first and second groups of electrically connected bottom electrodes allow for the selective formation of nanowires. P-type nanowires are formed on substrate by activating one of the groups of electrically connected electrodes during p-type material deposition. Similarly, n-type nanowires are formed on the substrate by activating the other group of electrically connected electrodes during n-type material deposition. Preferably, p-type nanowires and n-type nanowires are formed by electrochemical deposition in a nanopore formation layer deposited over the bottom electrode pattern on the substrate.

Also, it is preferred that the p-type nanowires and the n-type nanowires are interspersed among each other for easier thermocouple formation. The nanowires may be interspersed in a comb-like arrangement by patterning the first bottom electrode pattern such that the first group of bottom electrodes and the second group of bottom electrodes alternate spatially.

Top electrodes are formed to connect the p-type nanowires and the n-type nanowires at their top ends. Each top electrode should connect at least one p-type nanowire to at least one n-type nanowire. Placement of the top electrodes should complement the second bottom electrode pattern, which is discussed below.

For proper thermoelectric operation, the first bottom electrode pattern does not typically provide the proper connections to form thermocouples, in which a p-type nanowire is connected in series with an n-type nanowire, and in which thermocouples are connected in series and parallel with other thermocouples. Consequently, it is ordinarily desirable to replace the first bottom electrode pattern with a second bottom electrode pattern. In this aspect of the invention, two sets of holes are formed in the substrate. The first set of holes is formed to gain access to the first set of connections, which are removed. The second set of holes is formed to allow for the deposition or formation of a second set of connections, which will connect the bottom electrodes and form a second bottom electrode pattern. Thus, the second set of holes should allow for electrical access to the bottom electrodes without removing them.

Because holes are formed in the substrate to replace the first bottom electrode pattern, portions of the substrate are left intact, thereby avoiding removal of the entire substrate. Consequently, the substrate's structural integrity is maintained and the substrate may continue to provide support for the device. This support is especially beneficial since nanoscale structures, in particular these nanowires, are fragile in comparison to bulk structures. In addition, the substrate not only acts as a support structure but also may shield the nanowires from physical impact during device manufacture.

Preferably, the holes which are formed in the substrate have a keystone shape. The keystone shape is seen to provide two benefits. First, the keystone shape allows for a more even deposition of electrode materials. This is of benefit with respect to the second set of holes in which new connections are to be formed. Second, the keystone shape requires a less fine pattern for proper hole placement. This is due to the shape of the keystone, which is wider at the base than at the top. Formation of the base may be less fine, since the shape naturally narrows as it bores into the substrate. To achieve the keystone shape, potassium hydroxide is preferably used to etch the substrate.

Once the first set of holes is formed, the first set of connections between the bottom electrodes may be removed. Electrode materials are then deposited through the second set of holes to form a second bottom electrode pattern which connects to the bottom electrodes. Thus, the second bottom electrode pattern comprises the bottom electrodes and the second set of connections. Since the placement of the second set of holes determines the second bottom electrode pattern, the desired pattern is a factor in the placement of the second set of holes.

In another aspect of the present invention, numerous nanowires will be formed and many thermocouples will result. These thermocouples may be connected in series and/or in parallel. The exact configuration is determined by the second bottom electrode pattern and the placement of the top electrodes. Consequently, the placement of the top electrodes and the second bottom electrode pattern should be complementary such that they combine with the nanowires to form an array of functional thermocouples which is free of electrical shorts.

The combination of series and parallel connections may be modified to control the voltage and current output of the thermoelectric device. In this aspect of the invention, the second bottom electrode pattern may form banks of series connected thermocouples, wherein the banks are connected in parallel. By varying the combination, thermoelectric devices may have their output current and voltage tailored for specific applications.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE INVENTION

The present invention provides a method for fabricating a nanoscale thermoelectric module (TEM), wherein the thermoelements are nanowire structures. The TEM produced is expected to have more efficient thermoelectric qualities due to the nanowire thermoelements. Furthermore, the fabrication method that is likely to yield numerous advantages, such as a decreased likelihood of damage to the nanowires during device fabrication, adaptability to automation, and lower manufacturing costs.

Figure 1:
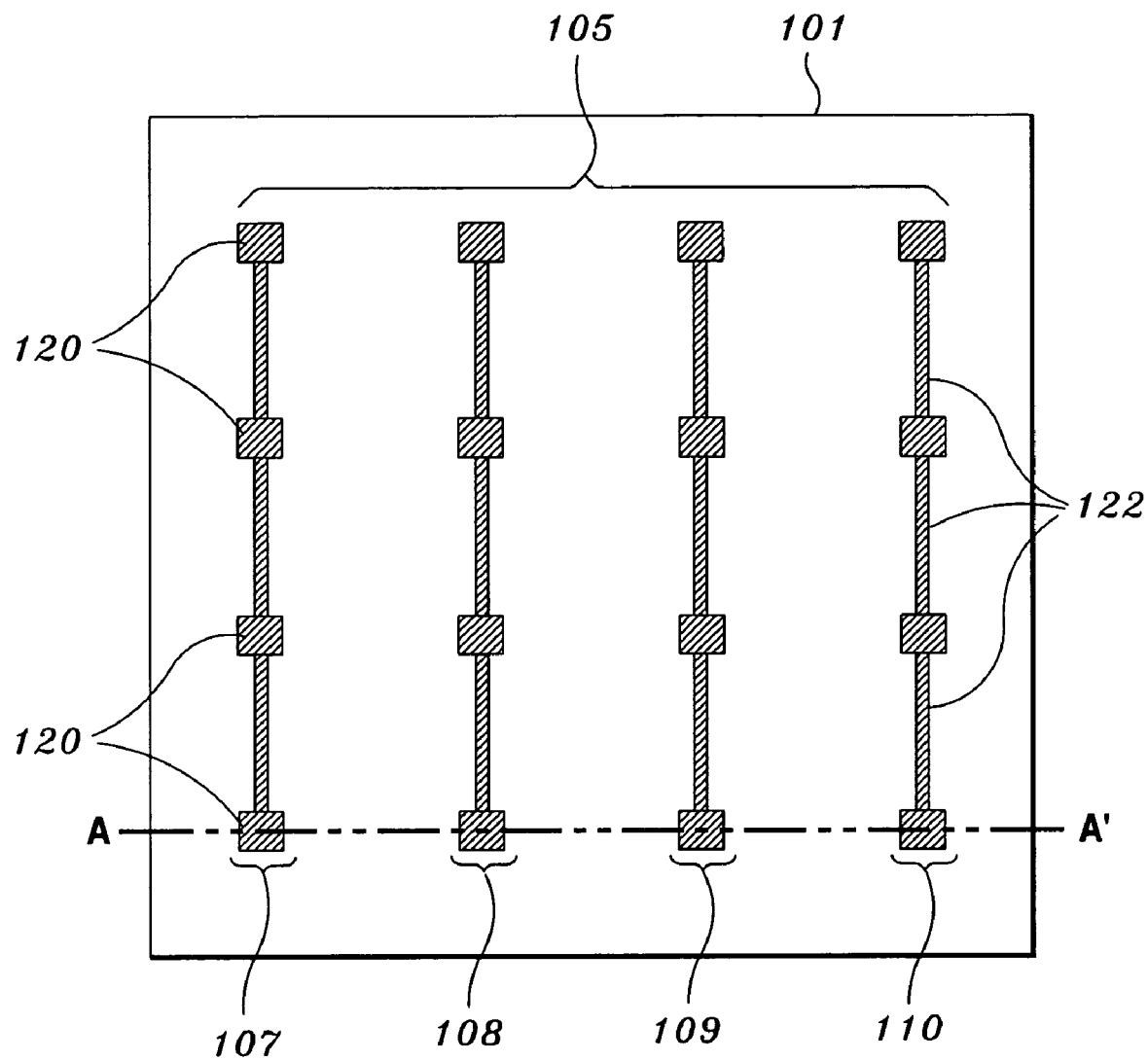
FIG. 1 shows an elevated view of a substrate with a first bottom electrode pattern deposited on its top surface.

In one aspect of the present invention, a substrate is provided upon which a first bottom electrode pattern is disposed. FIG. 1 is an elevated view of the top surface of an exemplary substrate (101) with a first bottom electrode pattern (105) disposed thereon, wherein the first bottom electrode pattern has a first electrically connected group of bottom electrodes; a second electrically connected group of bottom electrodes; and a first set of connections.

Figure 2:
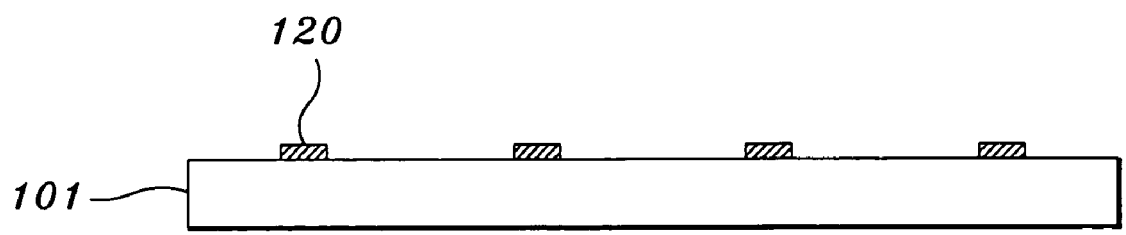
FIG. 2 shows a cross-sectional view of the structure of FIG. 1 at the A–A' axis.

FIG. 2 shows a cross-sectional view of the structure of FIG. 1 at the A–A' axis. From this view it is possible to see the thickness of the substrate, which is preferably made of a Si (silicon) wafer. The thickness may be adjusted a number of ways. For example, a 650 $\mu$m thickness of a Si wafer may be reduced to 100 $\mu$m, 40 $\mu$m or even 5 $\mu$m through polishing. The thickness of the substrate plays a role in both providing protection for the nanowires in a TEM and in determining the spacing the nanowires as will be discussed below.

The first bottom electrode pattern allows for the selective formation of nanowires by having at least two electrically connected groups of bottom electrodes which may be selectively activated. For example, in FIG. 1, in order to have two groups the first column of bottom electrodes (107) and third column of bottom electrodes (109) may belong to the first electrically connected group of bottom electrodes and the second column of bottom electrodes (108) and the fourth column of bottom electrodes (110) may belong to the second electrically connected group of bottom electrodes. Each column is made of bottom electrodes (120) and connecting electrodes (122).

The first electrically connected group of bottom electrodes may be used to form p-type nanowires and the second electrically connected group of bottom electrodes may be used to form n-type nanowires. By connecting together bottom electrodes used for p-type formation, they may be electrically activated together. Similarly, bottom electrodes used to form n-type nanowires may be connected so that they may be electrically activated together. Ideally, each bottom electrode will register with at least one nanowire.

Any electrically conductive material may be used to form the first bottom electrode pattern, but gold is preferred. Furthermore, multiple methods may be employed to provide the first bottom electrode pattern. One such method involves plating the top surface of the substrate with gold, then etching away the unnecessary portions to yield the desired pattern.

Figure 3:
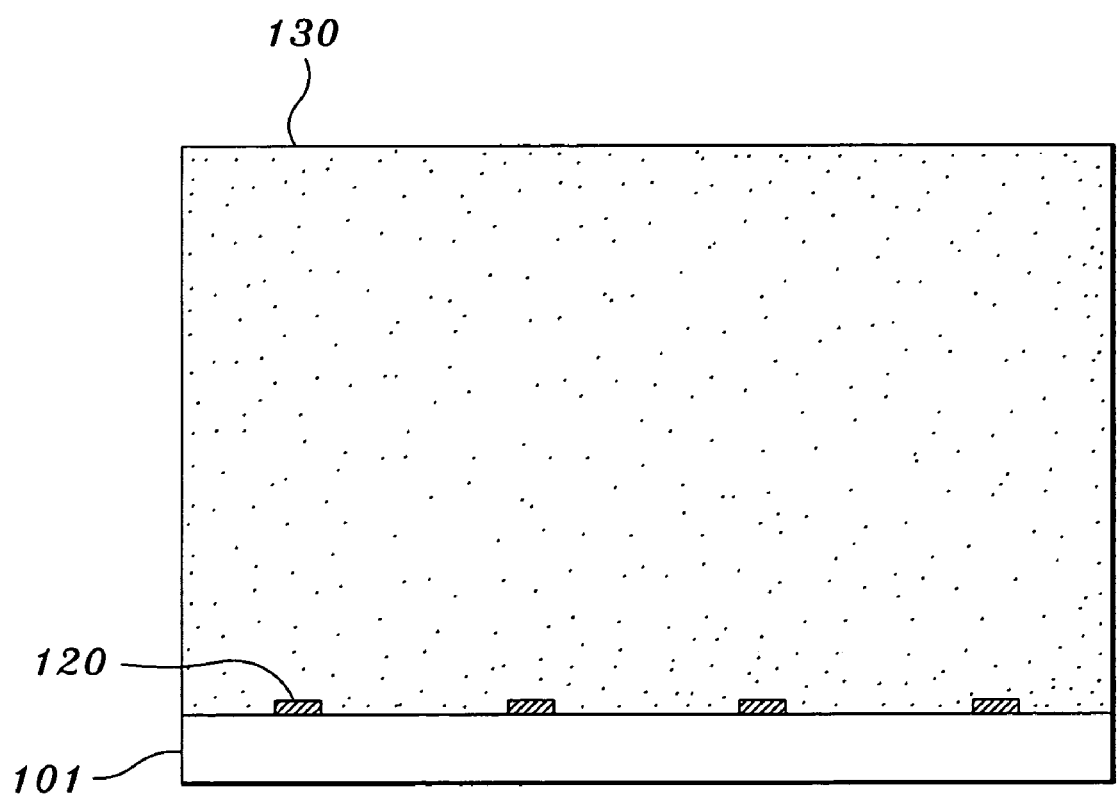
FIGS. 3 through 6 show a cross-sectional view of the a TEM during different stages of fabrication.
Figure 4:
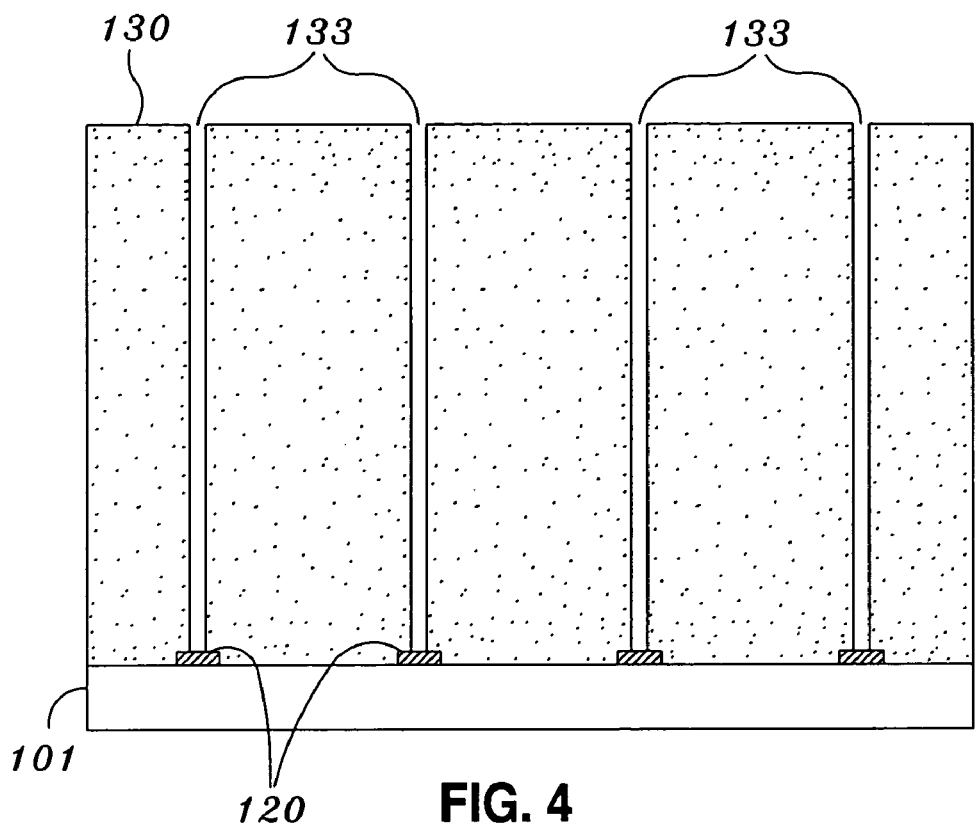
Figure 5:
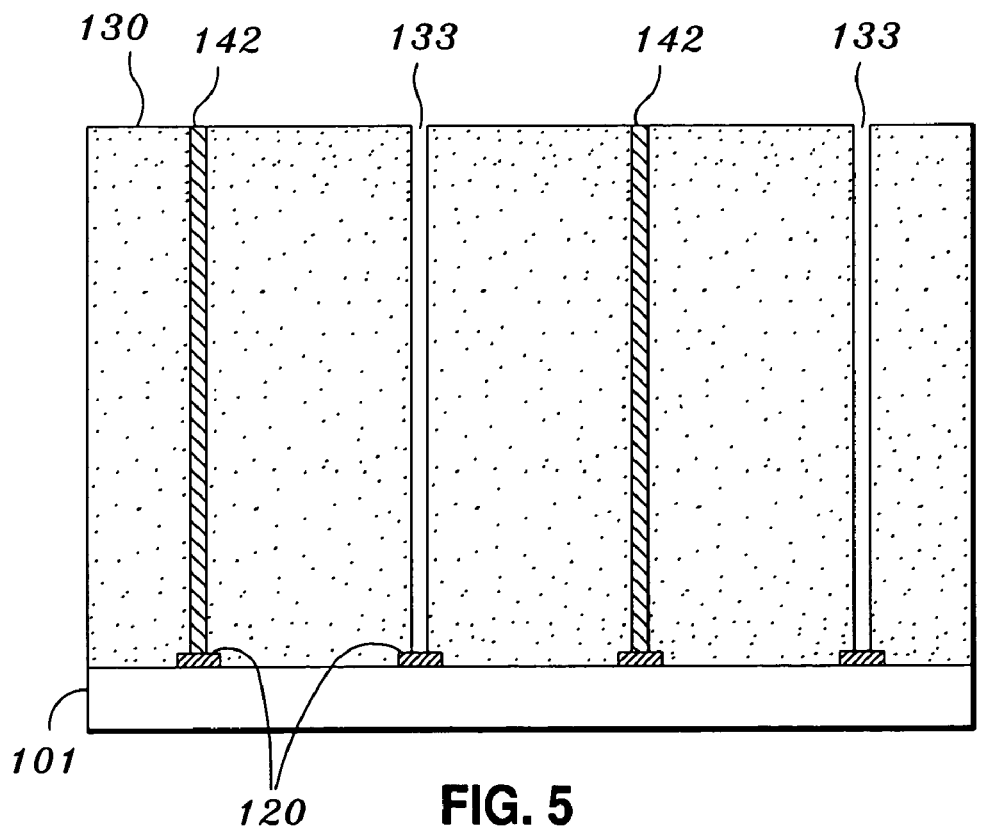
Figure 6:
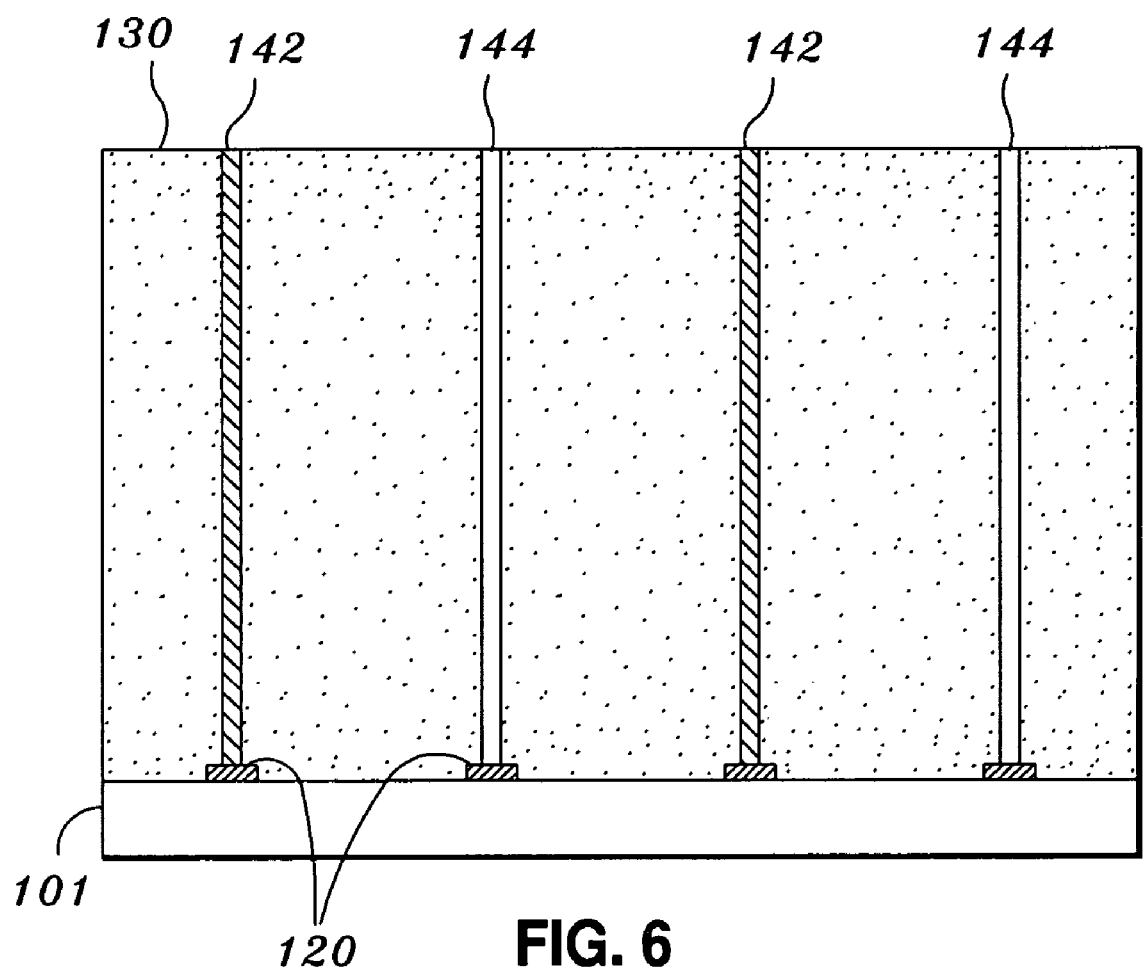

The nanowires used in the present invention may be acquired a number of ways. One method used in the present invention involves forming the nanowires within a nanopore. While it is possible to use a template with preformed nanopores, it is preferred that nanopores are formed after a nanopore formation layer is disposed on the substrate with through-electrodes. FIG. 3 shows a cross-sectional view of a substrate with a nanopore formation layer (130) disposed on the top surface of a substrate (101) and in contact with the bottom electrodes (120). Preferably, the nanopore formation layer covers the entire surface of the substrate, and is of a material which is appropriate for nanopore formation. The thickness of the formation layer may vary. However, since the thickness of the layer plays a part in determining the length of the nanowires formed, the thickness of the layer should be chosen according to the desired length of the nanowires Nanopores (133) are formed in the nanopore formation layer (130) in a manner that each pore registers with at least one bottom electrode (120), as shown in FIG. 4. Also it is preferred that each bottom electrode (120) connects to only one nanopore (133). Once the nanopores are formed, they may be filled with p-type and n-type materials to form nanowires, as shown in FIG. 5 and 6, forming p-type nanowires (142) and n-type nanowires (144).

A preferred method of forming the nanopores is through anodic oxidation. Any material which is suitable for anodic oxidation may be used as the nanopore formation layer, however aluminum is preferred. More preferably, anodic oxidation is used in combination with ion beam implantation, which seeds the nanopore formation layer for nanopore formation. Gallium ions have been used to provide nanopores in aluminum with excellent spacing. Ion beam implantation may allow for superior spacing and may provide for nanopores which register well with the substrate electrodes The nanopores of the present invention have a diameter of 5 nm to 500 nm and a depth of 1 $\mu$m to 500 $\mu$m. Preferably, the nanopores have a diameter of 5 nm to 100 nm. More preferably, the nanopores have a diameter of 10 nm to 50 nm. Furthermore, the nanopores should be spaced from 50 nm to 1 $\mu$m apart from each other. The nanopores have a 200 $\mu$m pitch. Preferably, the nanopores have a pitch that is less than 20 $\mu$m.

After the nanopore formation layer is disposed on the substrate and nanopores are provided, the present invention employs the first electrode pattern described above to selectively form p-type and n-type nanowires. Accordingly, the present invention allows for the formation of p-type nanowires interspersed among n-type nanowires and vice versa. This may be achieved by activating at least one group of electrically connected electrodes during p-type nanowire formation and activating at least one other group of electrically connected electrodes during n-type nanowire formation. Preferably, electrochemical deposition is used to form the nanowires Thus, when electrochemical deposition is used to provide nanowire formation, at least two different material baths are employed. For p-type nanowire formation, a p-type material bath is employed. During the p-type material bath, at least one group of electrically connected electrodes is activated. Thus, p-type nanowires are formed in select nanopores, while non-selected nanopores remain empty. FIG. 5 shows the result of p-type nanowire formation, wherein the p-type nanowires (142) have been formed.

In the n-type bath, at least one other group of electrically connected electrodes are activated. Accordingly, n-type nanowires (144) have been formed in the nanopores, as shown in FIG. 6.

Another technique which allows for selective growth of nanowires is to use photoresist to cover nanopores wherein deposition is not desired. For example, during p-type material deposition or formation, nanopores in which n-type nanowires are to be grown may be covered with photoresist to prevent the deposition or formation of p-type materials in that nanopore. Conversely, photoresist may be used to cover or block the deposition or formation of n-type materials in the nanopores meant for p-type materials.

Using the method described above, an array of p-type and n-type nanowires can be formed. The nanowires formed in the present invention have a diameter of 5 nm to 500 nm and a length of 1 $\mu$m to 500 $\mu$m. Preferably, the nanowires have a diameter of 5 nm to 100 nm. More preferably, the nanowires have a diameter of 10 nm to 50 nm. Furthermore, the nanowires should be spaced from 50 nm to 1 $\mu$m from each other. The nanowires have a 200 $\mu$m pitch. Preferably, the nanowires have a pitch less than 20 $\mu$m.

Figure 7:
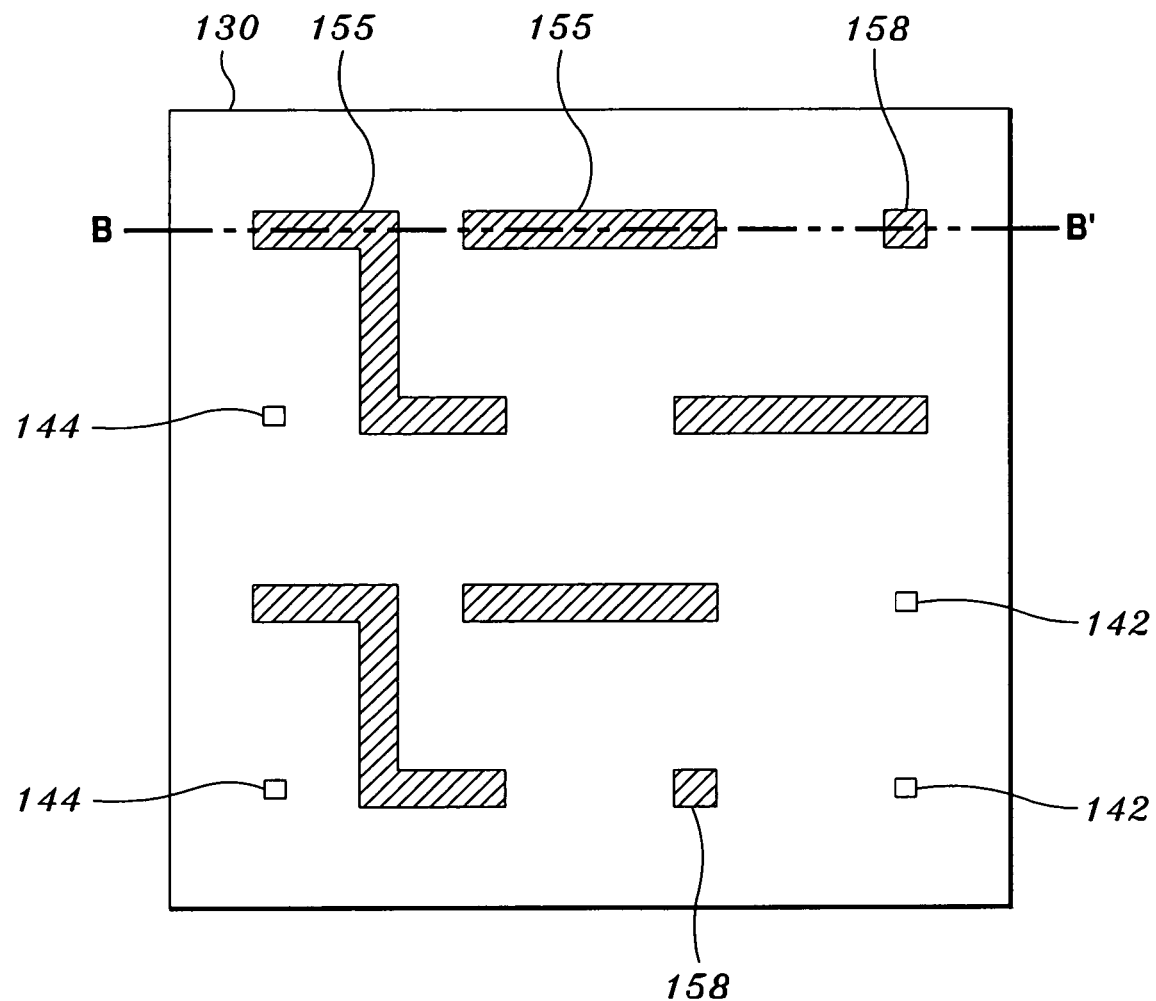
FIG. 7 shows an elevated view of a top electrode pattern deposited on the top surface of a nanopore formation layer.

A top electrode pattern, which comprises a plurality of top electrodes (155), may be formed in the nanopore formation layer (130), as shown in FIG. 7 which is an elevated view of top electrodes (155) forming a suitable top electrode pattern.

The top electrodes may serve to connect p-type nanowires and n-type nanowires at their ends which are furthest away from the substrate with through-electrodes or may serve as connection points to outside loads or power sources. For the purpose of connecting nanowires to each other, the top electrodes may contact more than one of each type of nanowire. However, it is preferred that each top electrode connects only one p-type nanowire and one n-type nanowire.

Figure 8:
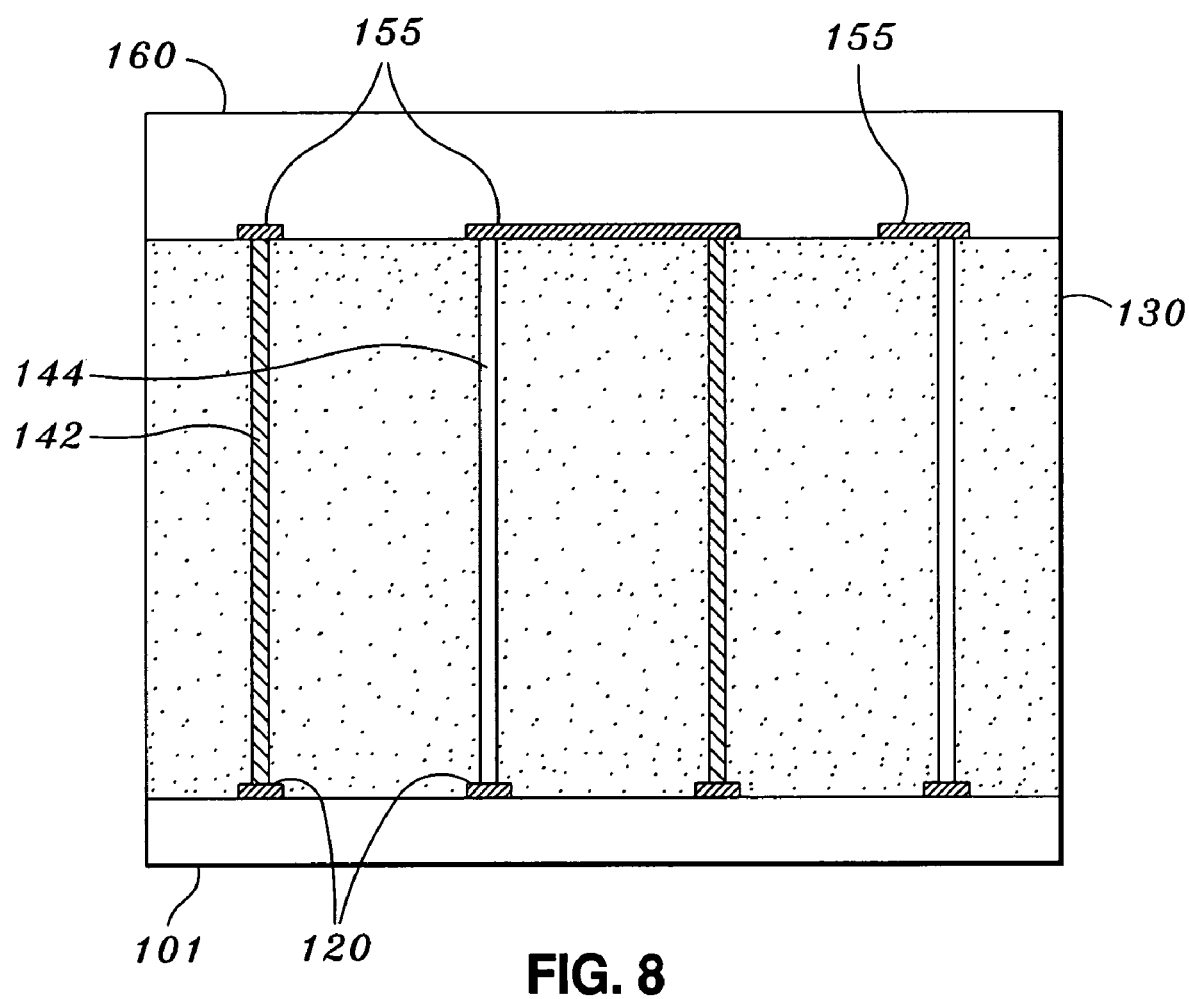
FIG. 8 shows a cross-sectional view of the structure in FIG. 7 at its B–B' axis.

As shown in FIG. 8, which is a cross sectional view of structure shown in FIG. 7 at the B–B' axis, once the top electrodes (155) have been placed, a top support layer (160) may be disposed over the top electrodes (155) and the nanopore formation layer (130).

Top electrodes should be placed in a pattern which is complimentary to the arrangement of the second bottom electrode pattern, which is discussed below. In other words, the top electrodes should be placed in a pattern which would not cause shorts or other undesirable effects when the electrode pattern on the bottom side of the TEM is finalized.

Since the first bottom electrode pattern, which was used to selectively grow p-type and n-type nanowires, may be unsuitable for thermoelectric purposes, it may be desirable to replace that pattern with a second bottom electrode pattern. The second bottom electrode pattern should compliment the placement of the top electrodes in such a fashion as to form functional thermoelectric couples connected in series and/or in parallel.

Figure 9:
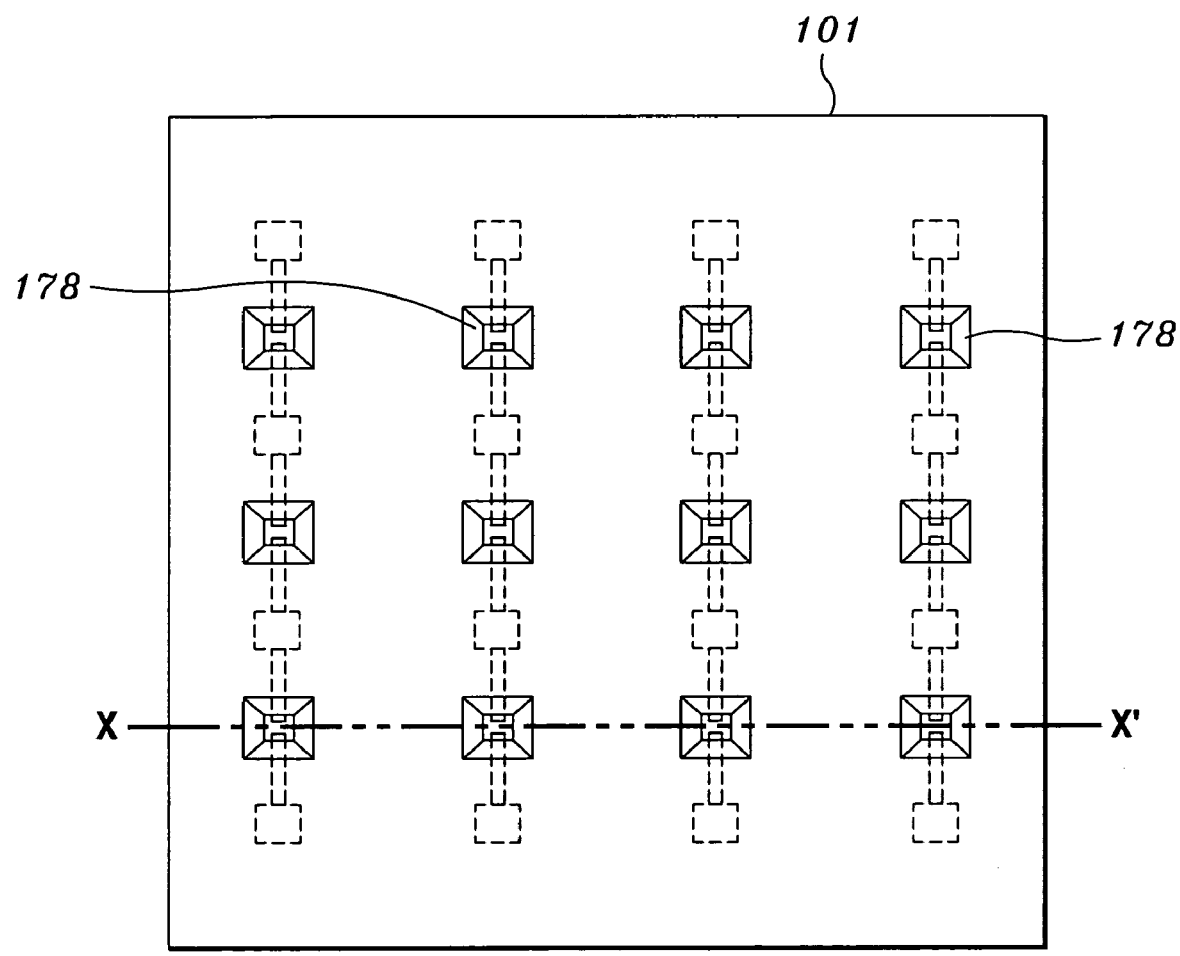
FIG. 9 shows an obverse view of the bottom surface of a substrate with a first set of hole formed therein and connection between bottom electrodes broken.
Figure 10:
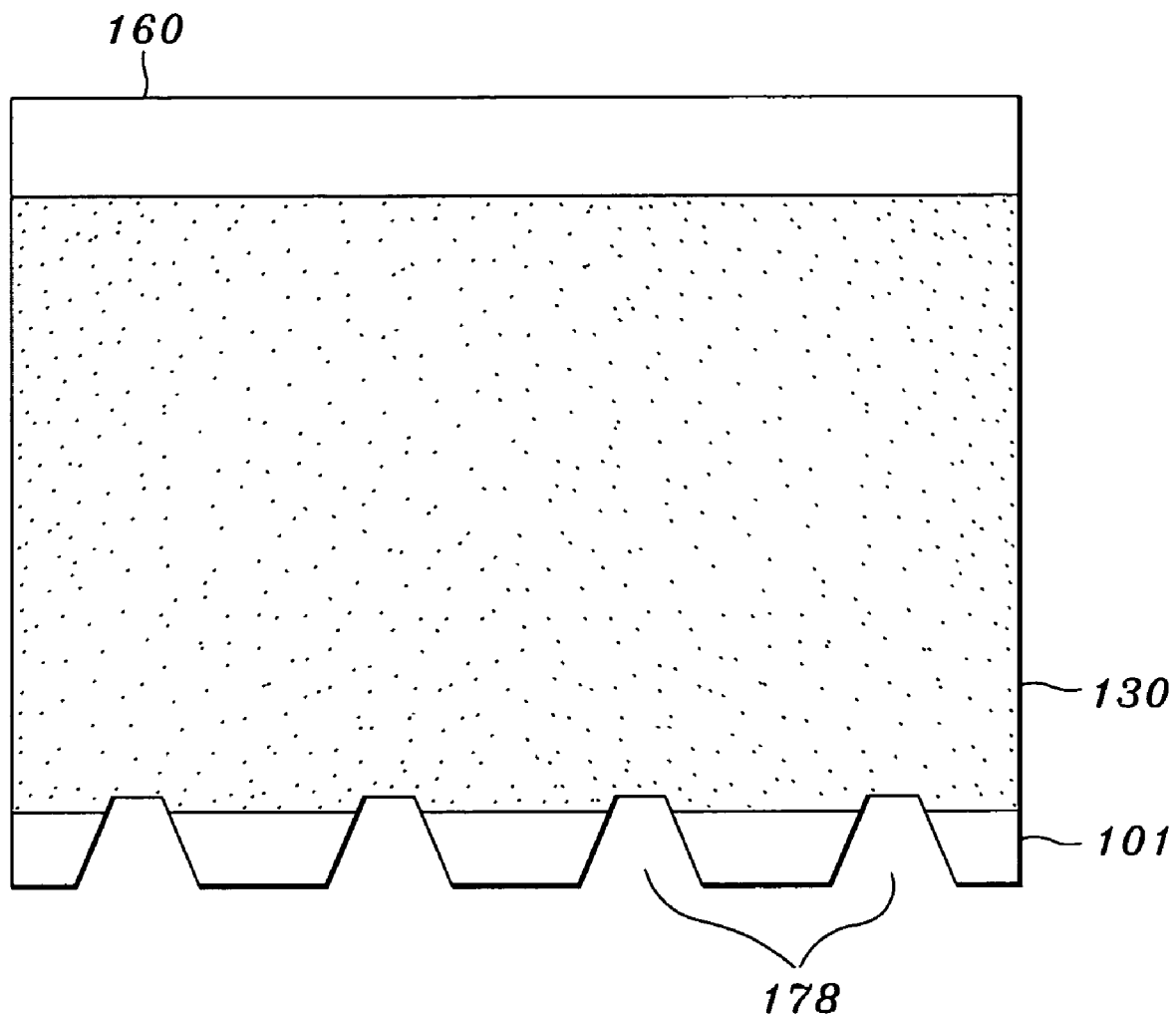
FIG. 10 shows a cross-sectional view of the structure in FIG. 9 at its X–X' axis.

FIG. 9 shows an obverse view of the bottom surface of the substrate (101), wherein a first set of holes (178) are formed in the substrate (101) to remove the first set of connections. In this example, the first set of connections are removed by removing a portion of the connecting electrode to break the electrical connectivity between bottom electrodes. FIG. 10 shows a cross-sectional of the structure shown in FIG. 9 at the X–X' axis. As shown in FIG. 10, a first set of holes (178) has been formed and portions of the connecting electrodes have been removed.

The holes may be formed by a mechanical process, but it is preferred that the holes are formed by etching. The holes may be of any shape, provided they allow for the removal of electrode materials. A keystone shaped hole allows for a less fine etching process to yield a more fine pattern, since the shape is wider at the base and narrows towards the apex. However, since the base of the keystone shape is wider than a hole with sides perpendicular to the surface and more of the substrate is removed, it may be necessary to space the nanowires further apart to maintain substrate integrity. The need to increase the distance between the nanowires increases as the thickness of the substrate increases, since wider keystone shaped holes are needed as substrate thickness increases.

Figure 11:
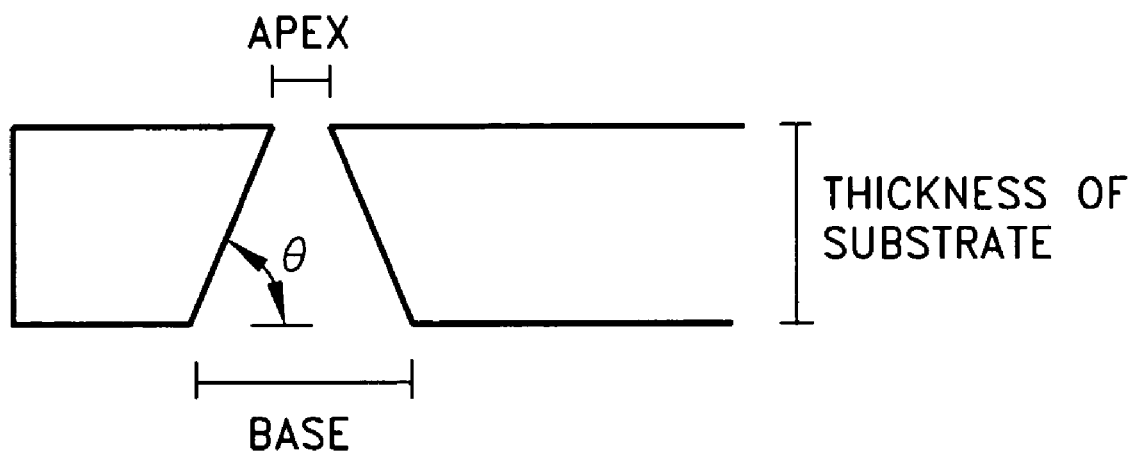
FIG. 11 shows a cross-sectional view of a hole with a key stone shape.

FIG. 11, shows a hole with a keystone shape, which may be formed using a KOH (potassium hydroxide) solution. Known etching processes may yield walls that form an angle $\theta=54.7°$. Since it is preferred that the holes formed in the substrate do not overlap, knowing the angle $\theta$ is useful to determine the spacing needed for the first set of holes and the spacing needed for the bottom electrodes and the nanowires which are formed. By knowing the width of the apex, the thickness of the substrate and the angle at which the walls lie, it is possible to determine the base. If the width of the apex is 0.2 $\mu$m and if the thickness of the substrate is 650 $\mu$m, the base would be equal to 920 $\mu$m; if the thickness of the substrate is 100 $\mu$m, the base would be equal to 142; if the thickness of the substrate is 40 $\mu$m, the base would be equal to 54; and if the thickness of the substrate is 5 $\mu$m, the base would be equal to 7.5 $\mu$m.

Preferably, each keystone shaped hole is spaced from another hole by a distance that is greater than the width of the base. Also, it is preferred that each bottom electrode is spaced from another bottom electrode by a distance that is greater than twice the width of a base.

Figure 12:
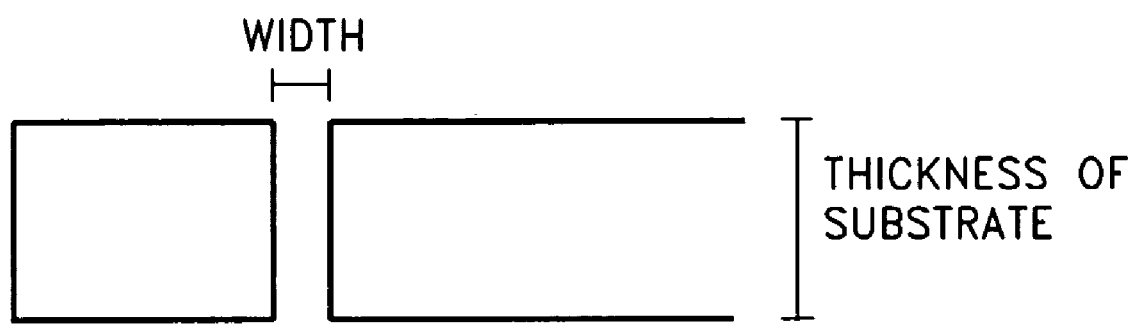
FIG. 12 shows a cross-sectional view a hole formed using inductively coupled plasma.

Etching by inductively coupled plasma (ICP) yields holes that have sides that are perpendicular to the surface, as shown in FIG. 12, and may also be used. Using this type of etching to form the holes allows for closer spacing of bottom electrodes and nanowires, however, a much finer etching process is required in comparison to using holes with keystone shapes.

In addition to the first set of holes, a second set of holes or elongated channels are formed to allow for the deposition of the second set of connections, which is part of the second bottom electrode pattern. A suitable example of the of the second bottom electrode pattern, which compliments the top electrode pattern shown in FIG. 13, which is an obverse view of the bottom surface of the substrate (101). As shown, both the first set of holes (178) and the second set of holes (189) are present. These holes may have any shape, provided that they allow for new connections between bottom electrodes to be formed. Keystone shape holes would have dimensions similar to the holes described with respect to the first set of holes, however, the holes would have a longer length to reach from one bottom electrode to another.

In addition, the depth of the second set of holes may vary. When the depth of the keystone shape is decreased, less substrate is removed. This is appropriate so long as the depths of the holes allow for registration with the bottom electrodes at the appropriate points.

With respect to the second set of holes, the keystone shaped holes is seen to yield an advantage, which is to allow for a more even deposition of the electrode material.

The second set of connections (195) may be formed by depositing electrode materials in the second set of holes (189). The deposited electrode materials become part of the second bottom electrode pattern, and the pattern shown in FIG. 13 compliments the pattern shown in FIG. 7.

Figure 13:
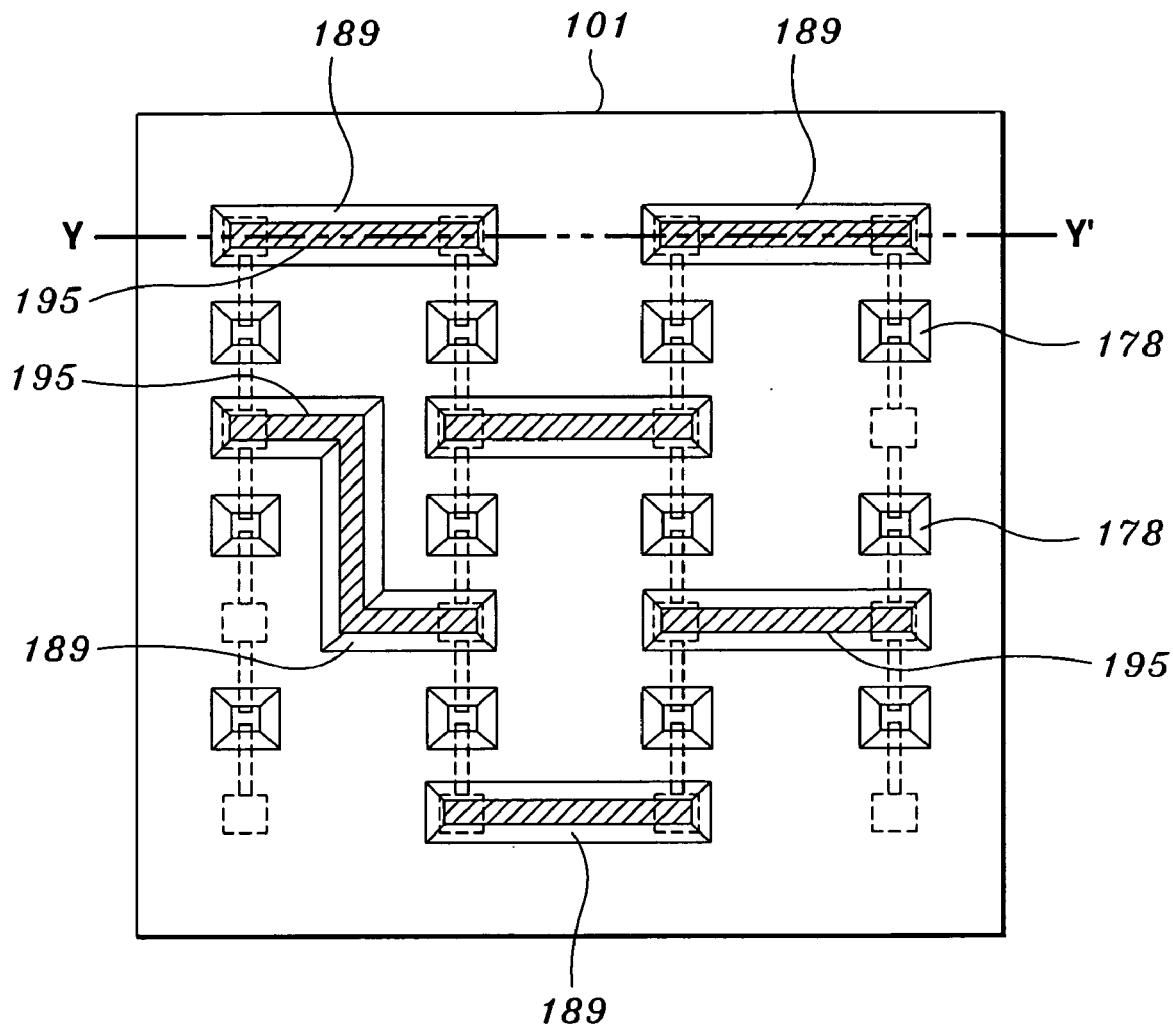
FIG. 13 shows an obverse view of the bottom surface of a substrate with both a first set of holes and a second set of holes formed therein.
Figure 14:
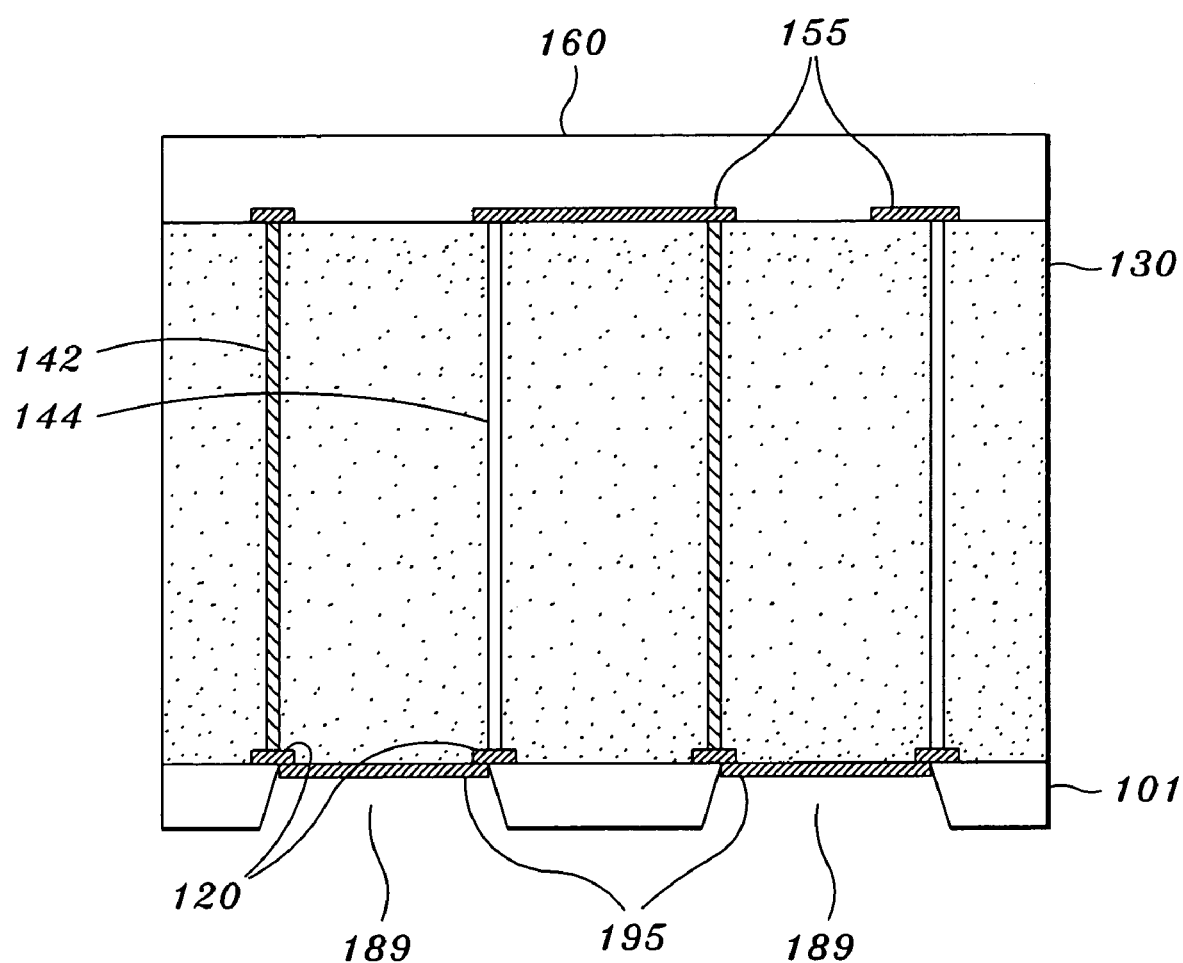
FIG. 14 shows cross-sectional view of the structure shown in FIG. 13 at its Y–Y' axis.

FIG. 14 is a cross-sectional view of the structure in FIG. 13 at the Y–Y' axis. As can be seen, the second set of connections (195) provides new connections for the bottom electrodes (120).

Because holes are used to replace the first bottom electrode pattern with the second electrode pattern, some of the structural integrity of the substrate is maintained. In particular, the substrate is left primarily intact where it contacts the bottom electrodes. By virtue of this feature, the substrate continues to lend structural support to the fragile nanowires and may continue to shield the nanowires from physical impact. Furthermore, once the second bottom electrode pattern is in place, the holes may be filled to add additional structural support.

As an example, wherein the substrate is 5 $\mu$m thick and the bottom electrodes are placed at a pitch of 10 $\mu$m×18.5 $\mu$m, the keystone shaped holes for the first set of holes will have a base that is 7.5 $\mu$m×7.5 $\mu$m. The dimensions of the keystone shaped holes for the second set of holes will vary, depending on the shape of the hole, but may be easily calculated.

Not all nanowires and their corresponding electrodes are electrically connected to the top electrode pattern and second bottom electrode pattern. In the present invention, it is not ordinarily necessary to connect all nanowires. In one aspect of the invention some nanowires may be left unconnected to insure that the p-type nanowires and the n-type nanowires are connected in an alternating pattern to allow a series connection. Alternatively, it is possible to prevent nanowire formation at positions where they are not needed or to form a hole and remove the electrodes at those positions.

However, connecting all nanowires is preferred. Thus, the placement of substrate electrodes, p-type and n-type nanowires and top electrodes as well as the formation of the second electrode pattern may be carefully planned to optimize the use of materials and space.

Either the top electrode pattern or the second bottom electrode pattern should allow for connection points for connecting the resulting TEM to a load or power supply. In the example shown in FIG. 7, top electrodes (158) may serve as connection points to a load or power supply.

Preferably, the second bottom electrode pattern connects the array of nanowires to form thermocouples which are connected in series, parallel or both. By controlling the number of thermocouples connected in series and/or parallel, it is possible to control the output current and voltage of the resulting TEM device. Consequently, TEMs produced by the present invention may be designed to produce different current and voltage outputs and thus may be designed for specific needs.

In the present invention, since so many nanowires may be produced, it may be difficult to design a second bottom electrode pattern. This difficulty may be dealt with by applying any general purpose optimization algorithm or, preferably, a genetic algorithm to determine an appropriate pattern for the second electrode pattern.

Once the electrode patterns have been finalized, the nanopore formation layer may be removed. Removal is preferred if the formation layer has high heat conductive properties or high electrical conductive properties. However, removal of the formation layer is not required.

If the nanopore formation layer is removed, then ideally the layer is not removed until absolutely necessary because the formation layer may provide structural support to the nanowires throughout device fabrication. By leaving the formation layer intact throughout device fabrication, the nanowires remain encased and are somewhat protected from movement and impact. On the other hand, once the nanowire formation layer is removed, the nanowires are left substantially free standing and may break or bend.

Although it is preferred to keep the nanopore formation layer in place as long as possible, eventual removal of the nanopore formation layer is also preferred. Thus, the space around the nanowires may be replaced with an insulating material, or more preferably a vacuum. An insulating material is desirable to keep the nanowires electrically isolated from each other, except for the electrodes provided, and it is desirable to keep their ends thermally isolated from each other. Furthermore, since a vacuum is seen to be the best insulator against heat and electrical conduction, a vacuum would be more preferred.

By the processes described above, an array of thermocouples may be formed. To finish the basic TEM structure, the array may be encapsulated to give additional structure and support. The resulting capsule should have one surface which corresponds to the bottom side of the substrate with through-electrodes and a second surface which overlays the top electrodes. These two surfaces lie on opposite sides of the TEM. By applying a temperature difference between these two surfaces an electrical current is expected to be produced. By applying a current to the nanowires within the TEM, a temperature difference between the two surfaces is expected. Hence, the TEM will have a higher temperature side and a lower temperature side.

An outer shell, produced by encapsulation, should be able to conduct heat to and away from the underlying electrodes and nanowires. Yet, at the same time, the outer shell should not allow for the conduction of heat from the higher temperature side to the lower temperature side, otherwise any applied temperature difference would be defeated.

There should be a means for electrically connecting the array of thermocouples to an outside load or power source. Thus, electrical leads may be provided that allow for electrical connectivity to the electrode patterns held within the TEM.

The resulting TEMs produced by the present invention may be used as power generators, cooling devices or both. As a power generator, the TEM may be placed near a heat source such that the high temperature side will receive heat. Due to the resulting temperature difference between the two sides of the TEM, a current will be produced. One application for the TEMs produced by the present invention is to recover lost energy by placing them in or on electronic devices which produce waste heat.

As discussed above, the operation of a TEM as a power generator is dependent upon the difference in temperature between the higher temperature side and the lower temperature side. To provide or enhance this temperature difference, pyrolytic graphite sheets (PGSs) may be used in combination with TEMs produced by the present invention. PGSs, which have excellent heat conducting properties, may be attached to the higher temperature side of a TEM to bring heat to the TEM. Consequently, through the use of PGSs, the TEM need not be placed close to a heat source to generate power. Alternatively, a PGS may be attached to the lower temperature side of a TEM to assist in the dissipation of heat and making the lower temperature side relatively cooler.

Alternatively, as cooling devices, the TEMs produced by the present invention would be placed near or on objects which need cooling and a current would be applied to the TEM to cool as necessary.

The present invention is defined by the claims and is understood to include such obvious variations and modifications as would be obvious to those of ordinary skill in the art.

What is claimed is:

1. A method for fabricating a nanowire thermoelectric device comprising the steps of:
   providing a substrate upon which to grow nanowires;
   forming a first electrode pattern on a top surface of the substrate, wherein the first electrode pattern comprises bottom electrodes and a first set of connections which connects the bottom electrodes to form first and second groups of electrically connected bottom electrodes;
   forming a p-type nanowire on the substrate by activating the first group of electrically connected bottom electrodes during p-type material electrodeposition;
   forming a n-type nanowire on the substrate by activating the second group of electrically connected bottom electrodes during n-type material electrodeposition;
   forming top electrodes to connect the p-type nanowire to the n-type nanowire;
   forming a first set of holes in the substrate to remove the first set of connections between the bottom electrodes;
   forming a second set of holes in the substrate to allow for electrical access to the bottom electrodes; and
   forming a second bottom electrode pattern, wherein the second bottom electrode pattern comprises the bottom electrodes and a second set of connections between the bottom electrodes, and wherein the second bottom electrode pattern is formed using the second set of holes.

2. The method for fabricating a nanowire thermoelectric device according to claim 1, wherein the holes are keystone shaped.

3. The method for fabricating a nanowire thermoelectric device according to claim 1, further comprising the steps of disposing a nanopore formation layer on the substrate and forming nanopores in the nanopore formation layer after the nanopore formation layer is disposed on the substrate.

4. The method for fabricating a nanowire thermoelectric device according to claim 3, wherein the nanopores in the nanopore formation layer are registered to the bottom electrodes.

5. The method for fabricating a nanowire thermoelectric device according to claim 3, wherein the nanopore formation layer comprises Al and anodic oxidation is used to create nanopores within the nanopore formation layer.

6. The method for fabricating a nanowire thermoelectric device according to claim 5, wherein the nanopore formation layer is removed prior to completion of the thermoelectric device.

7. The method for fabricating a nanowire thermoelectric device according to claim 6, wherein the nanopore formation layer is not removed until after the second electrode pattern is formed.

8. The method for fabricating a nanowire thermoelectric device according to claim 1, wherein either the p-type nanowire or the n-type nanowire is formed prior to the formation of another type of nanowire.

9. The method for fabricating a nanowire thermoelectric device according to claim 1, wherein many thermocouples are formed and are connected in series and/or parallel by the second bottom electrode pattern.

10. The method for fabricating a nanowire thermoelectric device according to claim 9, wherein the thermocouples form banks of series connected thermocouples and the banks of series connected thermocouples are connected in parallel.

11. The method for fabricating a nanowire thermoelectric device according to claim 1, further comprising the steps of encapsulating the substrate and nanowire thermocouples to form a nanowire thermoelectric module, and creating a vacuum around the nanowires.

* * * * *